(12) United States Patent
Kim

(10) Patent No.: US 8,981,554 B2
(45) Date of Patent: Mar. 17, 2015

(54) SEMICONDUCTOR PACKAGE HAVING HEAT SPREADER AND METHOD OF FORMING THE SAME

(71) Applicant: Hyun-Ki Kim, Cheonan-si (KR)

(72) Inventor: Hyun-Ki Kim, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/080,766

(22) Filed: Nov. 14, 2013

(65) Prior Publication Data

US 2014/0340849 A1 Nov. 20, 2014

(30) Foreign Application Priority Data

May 16, 2013 (KR) .................. 10-2013-0055876

(51) Int. Cl.
*H01L 23/10* (2006.01)
*H01L 23/34* (2006.01)

(52) U.S. Cl.
CPC ...................................... *H01L 23/34* (2013.01)
USPC ........... 257/706; 257/707; 257/712; 257/713; 257/686; 257/E23.101

(58) Field of Classification Search
CPC ...................... H01L 23/367; H01L 2225/1094; H01L 2225/06589
USPC ........... 257/706, 707, 712, 713, 686, E23.101
See application file for complete search history.

(56) References Cited

U.S. PATENT DOCUMENTS

| | | | | |
|---|---|---|---|---|
| 5,396,403 A | * | 3/1995 | Patel | .............................. 361/705 |
| 6,219,254 B1 | * | 4/2001 | Akerling et al. | .............. 361/763 |
| 6,266,771 B1 | * | 7/2001 | Bellare et al. | ................. 713/176 |
| 6,906,416 B2 | * | 6/2005 | Karnezos | ....................... 257/723 |
| 7,034,388 B2 | * | 4/2006 | Yang et al. | ..................... 257/686 |
| 7,196,403 B2 | * | 3/2007 | Karim | ........................... 257/675 |
| 7,361,986 B2 | | 4/2008 | Yuan et al. | |
| 7,446,409 B2 | | 11/2008 | Yang | |
| 7,626,261 B2 | | 12/2009 | Baek et al. | |
| 7,683,469 B2 | | 3/2010 | Oh et al. | |
| 8,184,439 B2 | | 5/2012 | Baek et al. | |
| 8,482,120 B2 | * | 7/2013 | Jafari et al. | .................... 257/712 |
| 2010/0213600 A1 | * | 8/2010 | Lau et al. | ....................... 257/693 |
| 2010/0230805 A1 | * | 9/2010 | Refai-Ahmed | ............... 257/712 |
| 2013/0049224 A1 | * | 2/2013 | Sutardja | ........................ 257/774 |
| 2013/0175699 A1 | * | 7/2013 | Haba et al. | ..................... 257/774 |

FOREIGN PATENT DOCUMENTS

| | | |
|---|---|---|
| JP | 3148718 B2 | 3/2001 |
| KR | 20070076084 A | 7/2007 |
| KR | 20070078223 A | 7/2007 |
| KR | 101056750 B1 | 8/2011 |
| KR | 101088086 B1 | 11/2011 |

\* cited by examiner

*Primary Examiner* — Nitin Parekh

(74) *Attorney, Agent, or Firm* — Renaissance IP Law Group LLP

(57) ABSTRACT

A lower package includes a semiconductor chip. A first upper package and a second upper package are disposed on the lower package. A heat spreader is disposed on the lower package. The heat spreader includes an upper plate and an extension part connected to the upper plate. At least a part of each of the first and second upper packages vertically overlaps the semiconductor chip. The upper plate may be arranged on the first upper package and the second upper package. The extension part may be arranged between the first upper package and the second upper package. The extension part has a vertical height that is greater than its horizontal width.

17 Claims, 22 Drawing Sheets

SEMICONDUCTOR PACKAGE HAVING HEAT SPREADER AND METHOD OF FORMING THE SAME

CROSS-REFERENCE TO RELATED APPLICATION

This application claims priority under 35 U.S.C. §119 to Korean Patent Application No. 10-2013-0055876 filed on May 16, 2013, the disclosure of which is hereby incorporated by reference in its entirety.

BACKGROUND

1. Field

Embodiments of the inventive concept relate to a package-on-package (POP) having a heat spreader, and a method of forming the same.

2. Description of Related Art

In order to meet the requirements of being light, thin, short, and small in electronic systems, recent studies have focused on the technology of installing semiconductor chips and a heat spreader in a single package.

SUMMARY

Embodiments of the inventive concept provide a semiconductor package having improved heat dissipation and that is advantageous to high integration.

Other embodiments of the inventive concept provide a method of forming a semiconductor package having improved heat dissipation and that is advantageous to high integration.

The advantages and features of the inventive concept are not limited to the above disclosure. Other advantages and features may become apparent to those of ordinary skill in the art based on the following descriptions.

In accordance with an aspect of the inventive concept, a semiconductor package includes a lower package having a semiconductor chip, first and second upper packages disposed on the lower package, and a heat spreader having an upper plate and an extension part connected to the upper plate, and arranged on the lower package. At least a part of the first and second upper packages may vertically overlap the semiconductor chip. The upper plate may be arranged on the first upper package and the second upper package. The extension part may be arranged between the first upper package and the second upper package. The extension part may have a vertical height that is greater than its horizontal width.

In some embodiments, the vertical height of the extension part may be greater than that of the first upper package.

In other embodiments, the extension part may be in contact with the lower package.

In still other embodiments, a thermal interface material (TIM) layer may be formed between the heat spreader and the lower package. The TIM layer may be in contact with the extension part and the lower package.

In yet other embodiments, the TIM layer may be in contact with the semiconductor chip.

In yet other embodiments, the horizontal width of the TIM layer may be greater than that of the semiconductor chip.

In yet other embodiments, the heat spreader may include a lower plate connected to the extension part. The extension part may be arranged between the upper plate and the lower plate. The lower plate may have a horizontal width that is greater than its vertical height.

In still other embodiments, the lower plate may extend between the first upper package and the lower package, and between the second upper package and the lower package.

In yet other embodiments, the horizontal width of the lower plate may be greater than that of the semiconductor chip.

In yet other embodiments, the heat spreader may include a side plate connected to a side surface of the upper plate.

In accordance with another aspect of the inventive concept, a semiconductor package includes a lower package having a semiconductor chip, first and second upper packages disposed on the lower package, and a heat spreader having an upper plate, a lower plate, and an extension part connected between the upper plate and the lower plate and arranged on the lower package. At least a part of the first and second upper packages may vertically overlap the semiconductor chip. The upper plate may be arranged on the first upper package and the second upper package. The extension part may be arranged between the first upper package and the second upper package. The lower plate may be arranged between the first upper package and the lower package and between the second upper package and the lower package.

In some embodiments, the lower plate may fully cover the semiconductor chip.

In other embodiments, a thermal interface material (TIM) layer may be formed between the lower plate and the lower package.

In still other embodiments, the TIM layer may be in contact with the semiconductor chip and the lower plate.

In yet other embodiments, the TIM layer may fully cover the semiconductor chip.

Some embodiments include a method for forming a semiconductor package. The method may include forming a thermal interface material layer on an upper plate of a heat spreader. The heat spreader may include the upper plate, a lower plate, and an extension part. The method may further include loading a first upper package on the upper plate of the heat spreader, loading a second upper package on the upper plate of the heat spreader, and sliding the first and second upper packages toward each other so that they are disposed adjacent to each other and spaced apart from each other by the extension part of the heat spreader.

Details of other embodiments are included in the detailed description and drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
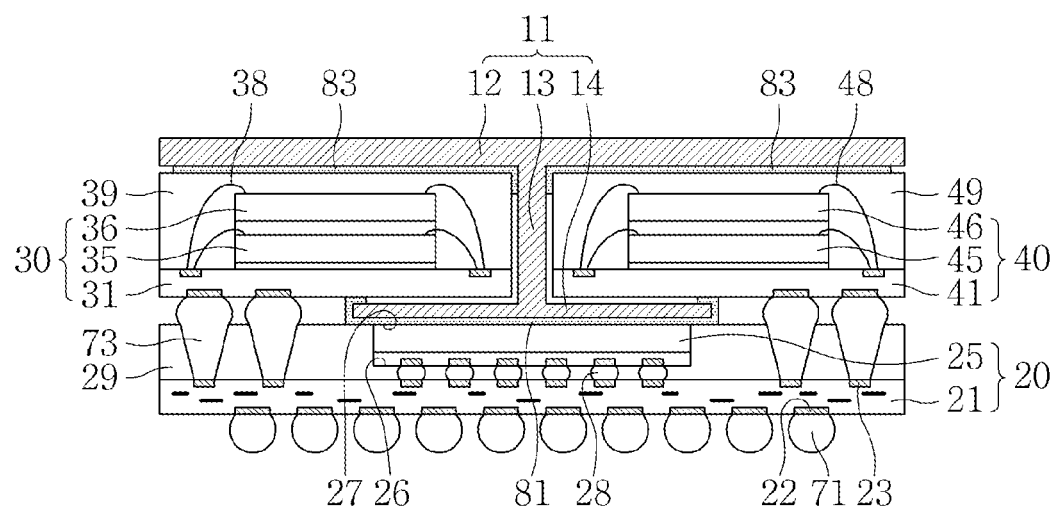
FIG. 1 is a cross-sectional view illustrating a semiconductor package in accordance with embodiments of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

It will be understood that, although the terms first, second, A, B, etc. may be used herein in reference to elements of the invention, such elements should not be construed as limited by these terms. For example, a first element could be termed a second element, and a second element could be termed a first element, without departing from the scope of the present invention. Herein, the term "and/or" includes any and all combinations of one or more referents.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein to describe embodiments of the invention is not intended to limit the scope of the invention. The articles "a," "an," and "the" are singular in that they have a single referent, however the use of the singular form in the present document should not preclude the presence of more than one referent. In other words, elements of the invention referred to in the singular may number one or more, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

FIG. 1 is a cross-sectional view illustrating a semiconductor package in accordance with embodiments of the inventive concept.

Referring to FIG. 1, a first upper package 30, a second upper package 40, and a heat spreader 11 may be installed on a lower package 20. The heat spreader 11 may include an upper plate 12, a first extension part 13, and a lower plate 14. The first extension part 13 may have a vertical height that is greater than its horizontal width (i.e., greater than its horizontal thickness). The first extension part 13 may have a greater vertical height than the first upper package 30 and the second upper package 40. The lower plate 14 may be sandwiched between the first upper package 30 and the lower package 20, and between the second upper package 40 and the lower package 20. The first extension part 13 may be connected between the upper plate 12 and the lower plate 14. The heat spreader 11 may be a unibody structure.

The lower package 20 may include a first semiconductor chip 25 mounted on a first board 21. The first board 21 may include a rigid printed circuit board, a flexible printed circuit board, or any combination thereof. The first board 21 may include a plurality of external electrodes 22, and a plurality of internal electrodes 23 electrically connected to the external electrodes 22. The internal electrodes 23 may be referred to as finger electrodes or board pads. Each of the external electrodes 22 and internal electrodes 23 may include Cu, Ti, TiN, Ta, TaN, W, WN, Ni, Au, Ag, Pt, Ru, or any combination thereof.

External terminals 71 may be formed on the external electrodes 22. Each of the external terminals 71 may include a solder ball, a conductive bump, a conductive paste, a lead grid array (LGA), a pin grid array (PGA), or any combination thereof. In other embodiments, the external terminals 71 may be omitted.

The first semiconductor chip 25 may be a logic chip, such as a microprocessor, a controller, an application processor (AP), or any combination thereof. The first semiconductor chip 25 may include an active surface 26 and a non-active surface 27 opposed to the active surface 26. The active surface 26 may be referred to as a front surface of the first semiconductor chip 25, and the non-active surface 27 may be referred to as a back surface of the first semiconductor chip 25. A plurality of active/passive devices may be formed on the active surface 26 of the first semiconductor chip 25.

A plurality of first connection terminals 28 may be formed between the first board 21 and the active surface 26. Each of the first connection terminals 28 may include a solder ball, a conductive bump, a conductive paste, or any combination thereof. One or more internal electrodes selected from the internal electrodes 23 may be in contact with the first connection terminals 28. The first semiconductor chip 25 may be electrically connected to the first board 21 via the first connection terminals 28.

The first board 21 may have a greater horizontal width than the first semiconductor chip 25. A first encapsulant 29 may be formed on the first board 21. The first encapsulant 29 may cover a side surface of the first semiconductor chip 25. The non-active surface 27 of the first semiconductor chip 25 and an upper surface of the first encapsulant 29 may be formed substantially at the same level. The first encapsulant 29 may include an epoxy molding compound (EMC).

The first upper package 30 may include a second semiconductor chip 35 and third semiconductor chip 36 mounted on a second board 31. The third semiconductor chip 36 may be vertically stacked on the second semiconductor chip 35. The second semiconductor chip 35 and the third semiconductor chip 36 may be connected to the second board 31 by second connection terminals 38. A second encapsulant 39 covering the second semiconductor chip 35 and the third semiconductor chip 36 may be formed on the second board 31.

The second upper package 40 may include a fourth semiconductor chip 45 and fifth semiconductor chip 46 mounted on a third board 41. The fifth semiconductor chip 46 may be vertically stacked on the fourth semiconductor chip 45. The fourth semiconductor chip 45 and the fifth semiconductor chip 46 may be connected to the third board 41 by third connection terminals 48. A third encapsulant 49 covering the fourth semiconductor chip 45 and the fifth semiconductor chip 46 may be formed on the third board 41.

The second board 31 and the third board 41 may include a rigid printed circuit board, a flexible printed circuit board, or any combination thereof. Each of the second semiconductor chip 35, the third semiconductor chip 36, the fourth semiconductor chip 45, and the fifth semiconductor chip 46 may be a memory chip, such as a volatile memory and/or a non-volatile memory. For example, each of the second semiconductor chip 35, the third semiconductor chip 36, the fourth semiconductor chip 45, and the fifth semiconductor chip 46 may include a mobile DRAM.

Each of the second semiconductor chip 35, the third semiconductor chip 36, the fourth semiconductor chip 45, and the fifth semiconductor chip 46 may have a different horizontal width and/or vertical thickness from the first semiconductor chip 25. The second connection terminals 38 and the third connection terminals 48 may include a bonding wire, a beam lead, a conductive tape, or any combination thereof. The second encapsulant 39 and the third encapsulant 49 may include an EMC.

In other embodiments, a plurality of other semiconductor chips may be stacked on the third semiconductor chip 36 or the fifth semiconductor chip 46.

The first upper package 30 and the second upper package 40 may be mounted on the lower package 20 using fourth connection terminals 73 passing through the first encapsulant 29. Each of the fourth connection terminals 73 may include a solder ball, a conductive bump, an LGA, a PGA, or any combination thereof. The first upper package 30 and the second upper package 40 may be formed substantially at the same horizontal level. The second upper package 40 may be spaced apart from the first upper package 30.

At least a part of the first upper package 30 may vertically overlap the first semiconductor chip 25. In other words, at least a part of the first upper package 30 may be disposed above the first semiconductor chip 25. Similarly, at least a part of the second semiconductor chip 35 may vertically overlap the first semiconductor chip 25.

At least a part of the second upper package 40 may vertically overlap the first semiconductor chip 25. In other words, at least a part of the second upper package 40 may be disposed above the first semiconductor chip 25. Similarly, at least a part of the fourth semiconductor chip 45 may vertically overlap the first semiconductor chip 25.

Some internal electrodes selected from the internal electrodes 23 of the first board 21 may be in contact with the fourth connection terminals 73. The fourth connection terminals 73 may be in contact with the second board 31 and/or the third board 41. The second semiconductor chip 35 and the third semiconductor chip 36 may be electrically connected to the first semiconductor chip 25 via the second connection terminals 38, the second board 31, the fourth connection terminals 73, the first board 21, and the first connection terminals 28. The fourth semiconductor chip 45 and the fifth semiconductor chip 46 may be electrically connected to the first semiconductor chip 25 via the third connection terminals 48, the third board 41, the fourth connection terminals 73, the first board 21, and the first connection terminals 28.

The heat spreader 11 may include Cu, Al, Ti, TiN, Ta, TaN, W, WN, Ni, Au, Ag, Pt, Ru, or any combination thereof. For example, the heat spreader 11 may be a Cu plate or an Al plate. The upper plate 12 may cover the first upper package 30 and the second upper package 40. The first extension part 13 may be formed between the first upper package 30 and the second upper package 40. A first thermal interface material (TIM) layer 81 may be formed between the lower plate 14 and the lower package 20. The first thermal interface material layer 81 may be in contact with the lower plate 14 and the lower package 20. The first thermal interface material layer 81 may be in contact with the non-active surface 27 of the first semiconductor chip 25.

A second thermal interface material layer 83 may be formed between the upper plate 12 and the first upper package 30, and between the upper plate 12 and the second upper package 40. The second thermal interface material layer 83 may extend between the first extension part 13 and the first upper package 30, and between the first extension part 13 and the second upper package 40. The first thermal interface material layer 81 and the second thermal interface material layer 83 may include aluminum oxide (AlO), zinc oxide (ZnO), a curable resin, or any combination thereof.

The heat spreader 11 may function to dissipate heat generated from the lower package 20, the first upper package 30, and the second upper package 40, and then to the atmosphere. The first thermal interface material layer 81 and the second thermal interface material layer 83 may function to transfer the heat generated from the lower package 20, the first upper package 30, and the second upper package 40 to the heat spreader 11. The first extension part 13 may have a vertical height that is greater than its horizontal width (i.e., greater than its horizontal thickness). The distance between the first upper package 30 and the second upper package 40 may therefore be reduced.

Heat generated from the first semiconductor chip 25 may be dissipated to the atmosphere via the first thermal interface material layer 81 and the heat spreader 11. The lower plate 14 may function to prevent the heat generated from the first semiconductor chip 25 from being transferred to the first upper package 30 and the second upper package 40. For example, the heat spreader 11 may channel heat from the first semiconductor chip 25 by gathering the heat at the lower plate 14, channeling the heat through the first extension part 13 thereby avoiding the first upper package 30 and the second upper package 40, and into the upper plate 12 for dispersion into the atmosphere.

The first thermal interface material layer 81 may function to prevent the heat generated from the first semiconductor chip 25 from being transferred to the first upper package 30 and the second upper package 40. The lower plate 14 may function to prevent heat generated from the first upper package 30 and the second upper package 40 from being transferred to the first semiconductor chip 25. The first thermal interface material layer 81 may function to prevent the heat generated from the first upper package 30 and the second upper package 40 from being transferred to the first semiconductor chip 25.

FIGS. 2 to 12 are perspective views illustrating heat spreaders in accordance with embodiments of the inventive concept.

Figure 2:
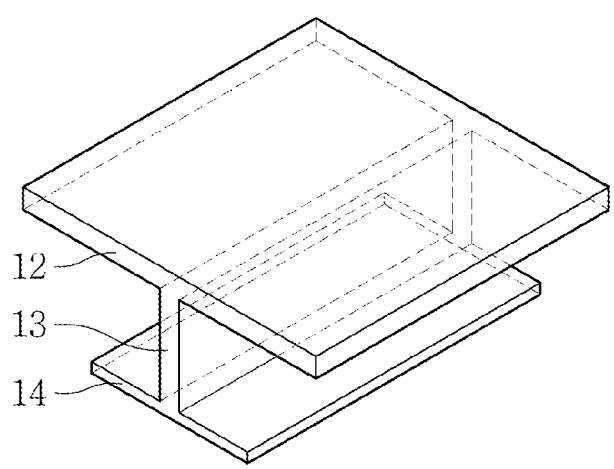
FIGS. 2 to 12 are perspective views illustrating heat spreaders in accordance with embodiments of the inventive concept.

Referring to FIG. 2, a heat spreader 11 may include an upper plate 12, a first extension part 13, and a lower plate 14. The upper plate 12 may have a greater horizontal width than the lower plate 14. The first extension part 13 may be connected between the upper plate 12 and the lower plate 14. The heat spreader 11 may have a unibody structure. The upper plate 12 may have a horizontal width that is greater than its vertical height (i.e., greater than its vertical thickness). The first extension part 13 may have a vertical height that is greater than its horizontal width (i.e., greater than its horizontal thickness). The lower plate 14 may have a horizontal width that is greater than its vertical height (i.e., greater than its vertical thickness).

Figure 3:
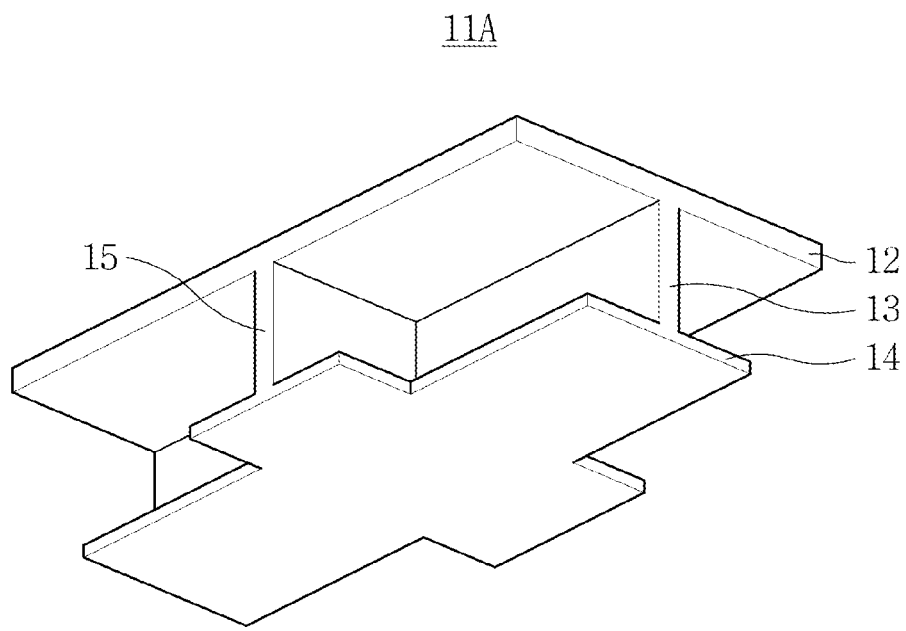

Referring to FIG. 3, a heat spreader 11A may include an upper plate 12, a first extension part 13, a second extension part 15, and a lower plate 14. The second extension part 15 may intersect the first extension part 13. The first extension part 13 and the second extension part 15 may form a '+' shape. The second extension part 15 may have a vertical height that is greater than its horizontal width (i.e., greater than its horizontal thickness). The first extension part 13 and the second extension part 15 may be connected between the upper plate 12 and the lower plate 14.

Figure 4:
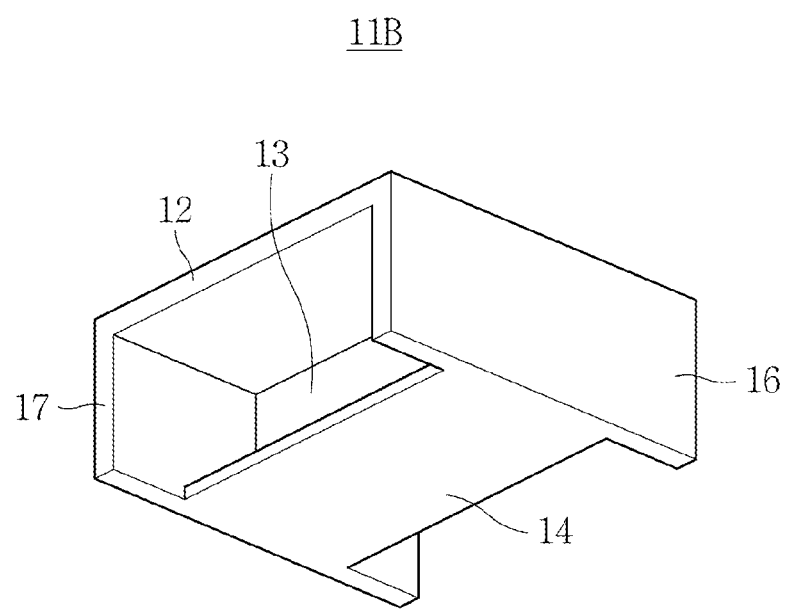

Referring to FIG. 4, a heat spreader 11B may include an upper plate 12, a first extension part 13, a first side plate 16, a second side plate 17, and a lower plate 14. The first side plate 16 may be connected to a side surface of the upper plate 12. The second side plate 17 may be connected to the other side of the upper plate 12. The second side plate 17 may face the first side plate 16. The first side plate 16 and the second side plate 17 may be connected to side surfaces of the first extension part 13. The first side plate 16 and the second side plate 17 may be connected to side surfaces of the lower plate 14. The extension part 13 may be connected to a lower surface of the upper plate and to an upper surface of the lower plate 14.

Figure 5:
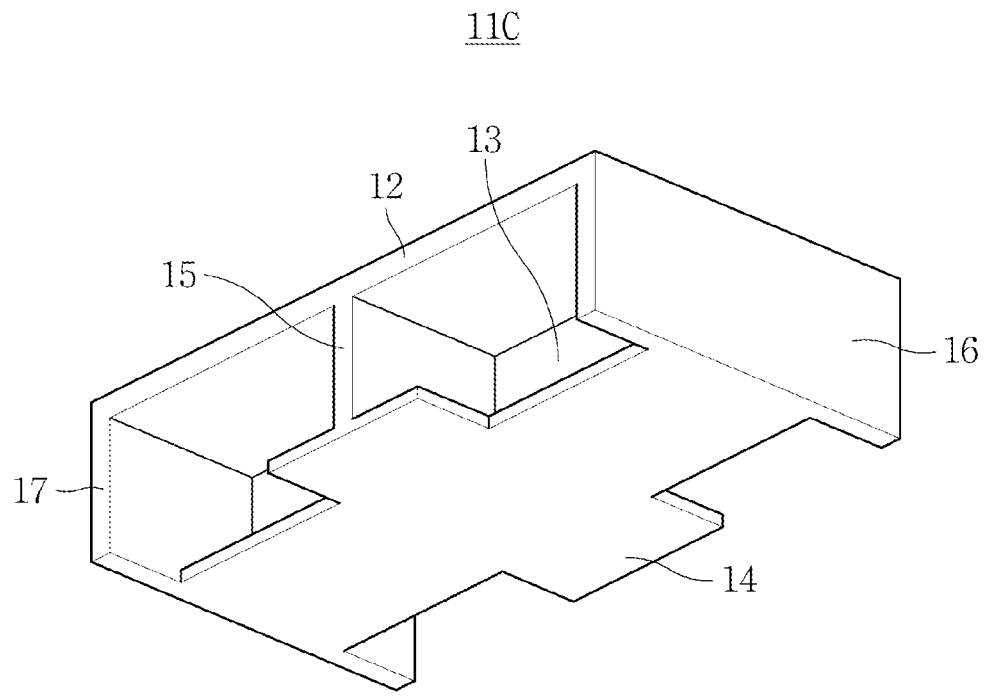

Referring to FIG. 5, a heat spreader 11C may include an upper plate 12, a first extension part 13, a second extension part 15, a first side plate 16, a second side plate 17, and a lower plate 14. The second extension part 15 may intersect the first extension part 13. Each of the first extension part 13 and the second extension part 15 may be connected to the upper plate 12, the lower plate 14, the first side plate 16, and the second side plate 17.

Figure 6:
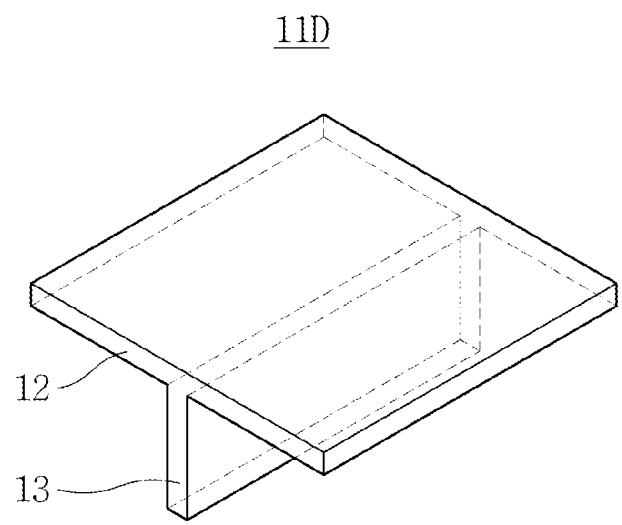

Referring to FIG. 6, a heat spreader 11D may include an upper plate 12 and a first extension part 13. The first extension part 13 may be connected to the upper plate 12.

Figure 7:
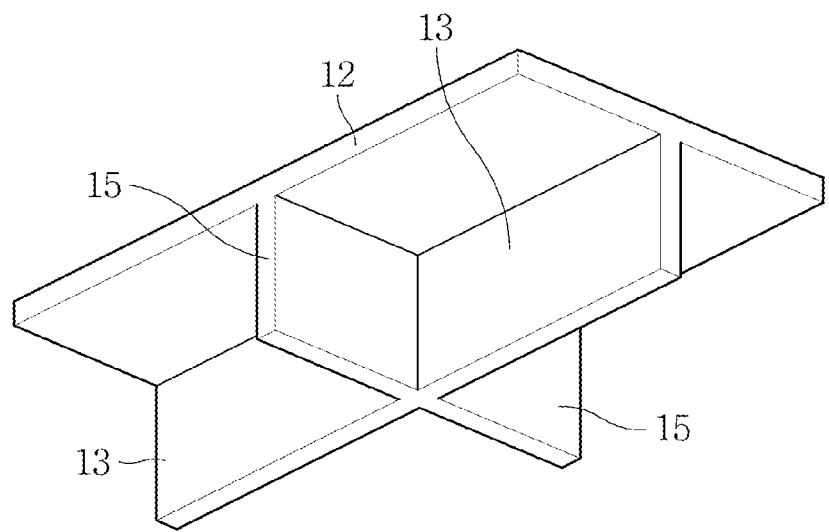

Referring to FIG. 7, a heat spreader 11E may include an upper plate 12, a first extension part 13, and a second extension part 15. The first extension part 13 and the second extension part 15 may be connected to the upper plate 12. The second extension part 15 may intersect the first extension part 13.

Figure 8:
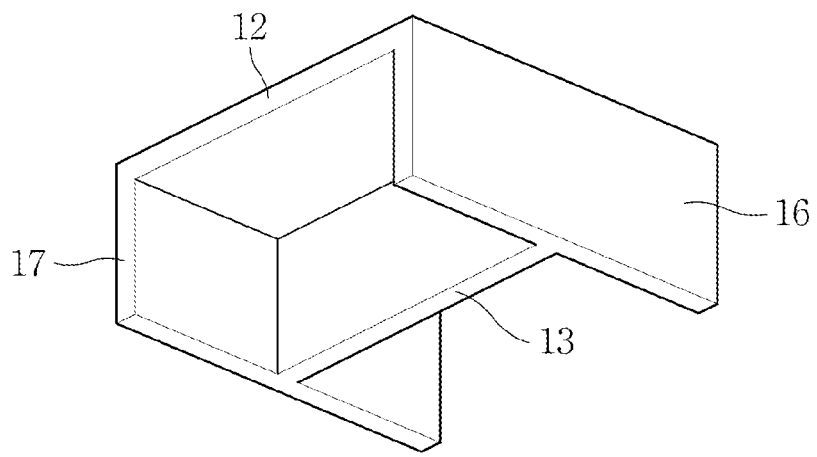

Referring to FIG. 8, a heat spreader 11F may include an upper plate 12, a first extension part 13, a first side plate 16, and a second side plate 17. The first extension part 13 may be connected to the upper plate 12, the first side plate 16, and the second side plate 17.

Figure 9:
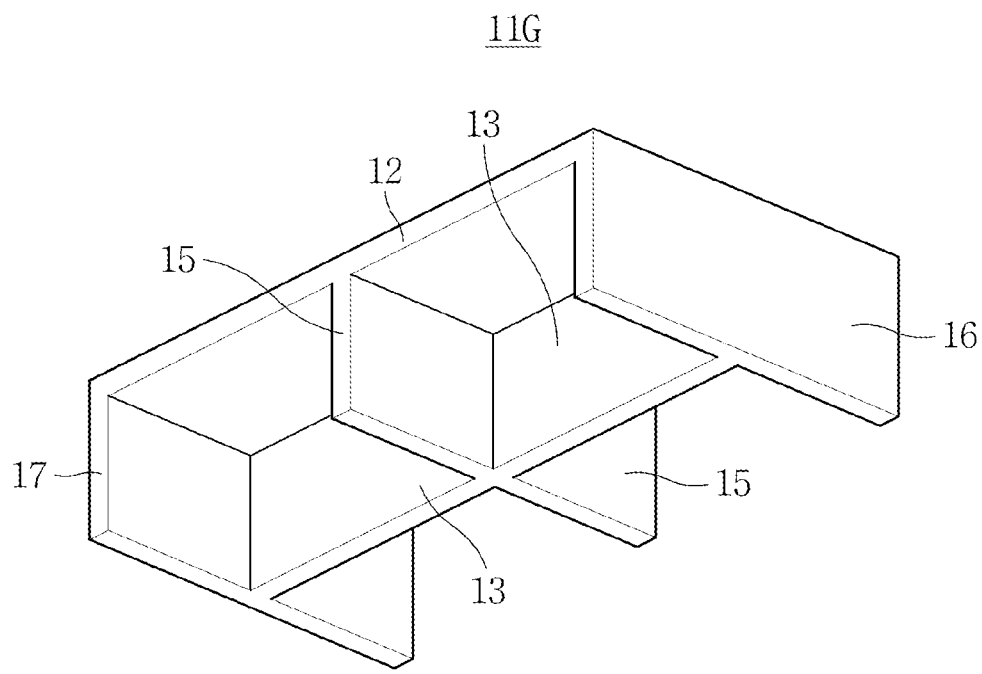

Referring to FIG. 9, a heat spreader 11G may include an upper plate 12, a first extension part 13, a second extension part 15, a first side plate 16, and a second side plate 17. The second extension part 15 may intersect the first extension part 13. Each of the first extension part 13 and the second extension part 15 may be connected to the upper plate 12, the first side plate 16, and the second side plate 17.

Figure 10:
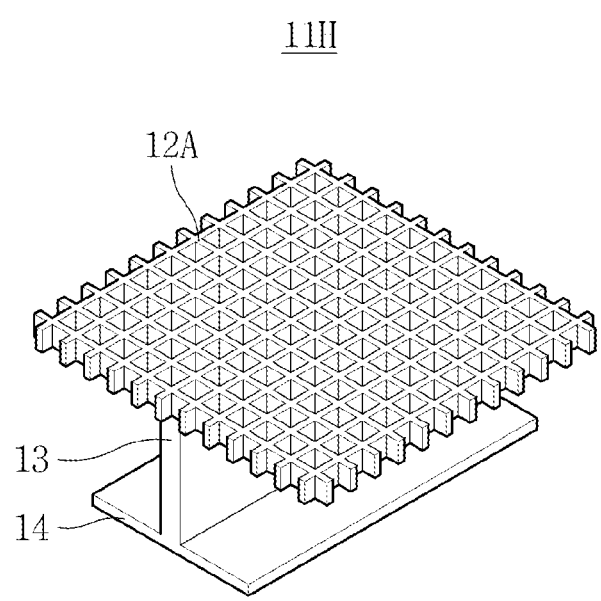

Referring to FIG. 10, a heat spreader 11H may include various kinds of prominences and depressions in order to enlarge a surface area. For example, an upper plate 12A may include a grid-shaped or a net-shaped structure.

Figure 11:
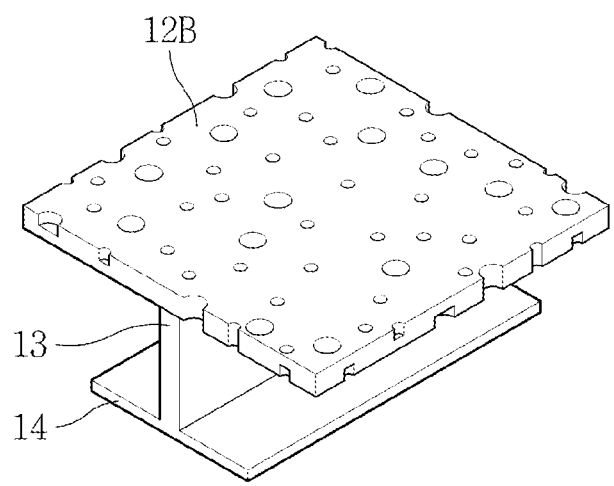

Referring to FIG. 11, a heat spreader 11I may include an upper plate 12B having a porous material layer.

Figure 12:
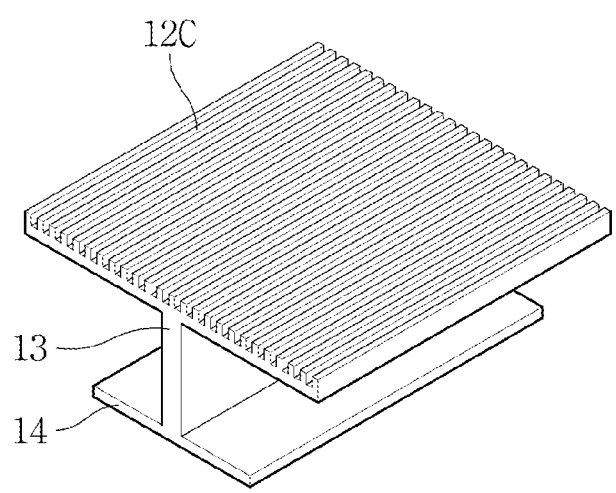

Referring to FIG. 12, a heat spreader 11J may include an upper plate 12C having grooves.

It will be understood that the various different kinds of upper plates disclosed herein, such as those with reference to FIGS. 10-12, can be combined or otherwise used in conjunction with any of the embodiments of the inventive concept illustrated and described herein. For example, the upper plate of any one of FIGS. 1-9 can have the physical characteristics as those illustrated and described with reference to FIGS. 10-12.

FIGS. 13 to 16 are cross-sectional views illustrating semiconductor packages in accordance with embodiments of the inventive concept.

Figure 13:
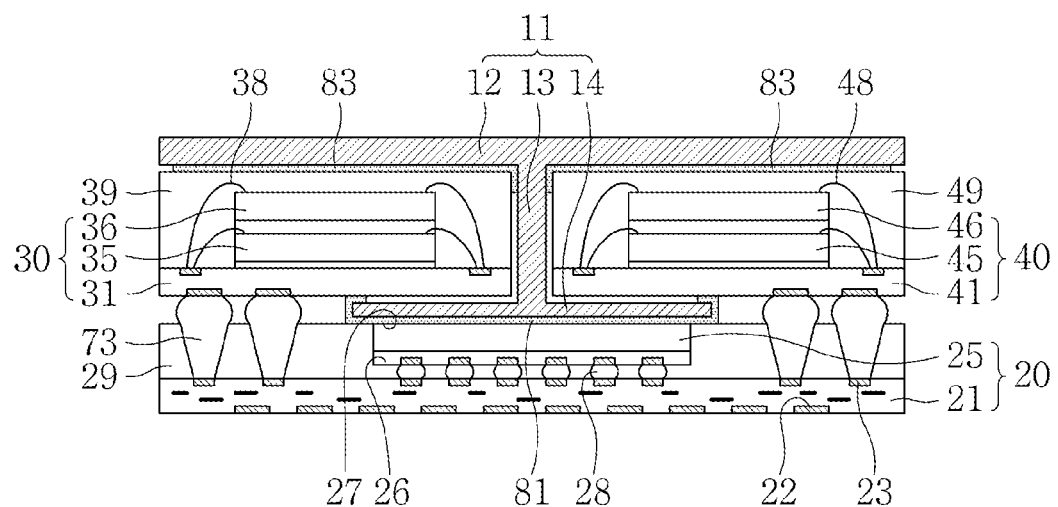
FIGS. 13 to 16 are cross-sectional views illustrating semiconductor packages in accordance with embodiments of the inventive concept.

Referring to FIG. 13, the external terminals (e.g., reference numeral 71 in FIG. 1) are omitted, but it will be understood that such external terminals may be used with this and other embodiments of the inventive concept disclosed herein. External electrodes 22 may be exposed on a bottom of a lower package 20. The external electrodes 22 may include a conductive tab, a finger electrode, an LGA, a PGA, or any combination thereof. In other embodiments, the external electrodes 22 may be omitted.

In still other embodiments, a first board 21 may correspond to a board of a card package, a board of an embedded multimedia chip (eMMC), a motherboard, or the like.

Figure 14:
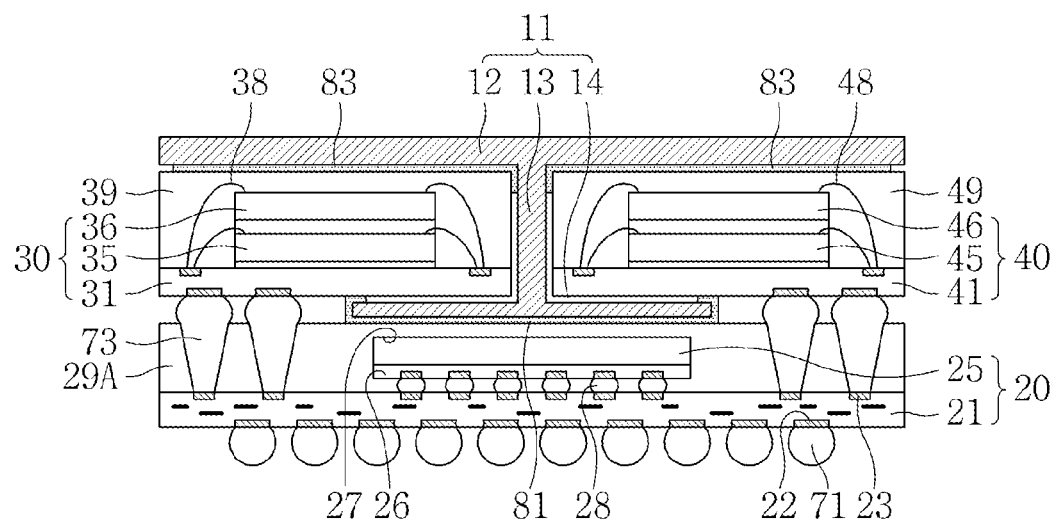

Referring to FIG. 14, a first encapsulant 29A may cover side and upper surfaces of a first semiconductor chip 25. A lower plate 14 may be formed on the first encapsulant 29A. A first thermal interface material layer 81 may be formed between the first encapsulant 29A and the lower plate 14. The first thermal interface material layer 81 may be in contact with the first encapsulant 29A and the lower plate 14. Heat generated from the first semiconductor chip 25 may be transferred to the lower plate 14 via the first encapsulant 29A and the first thermal interface material layer 81.

Figure 15:
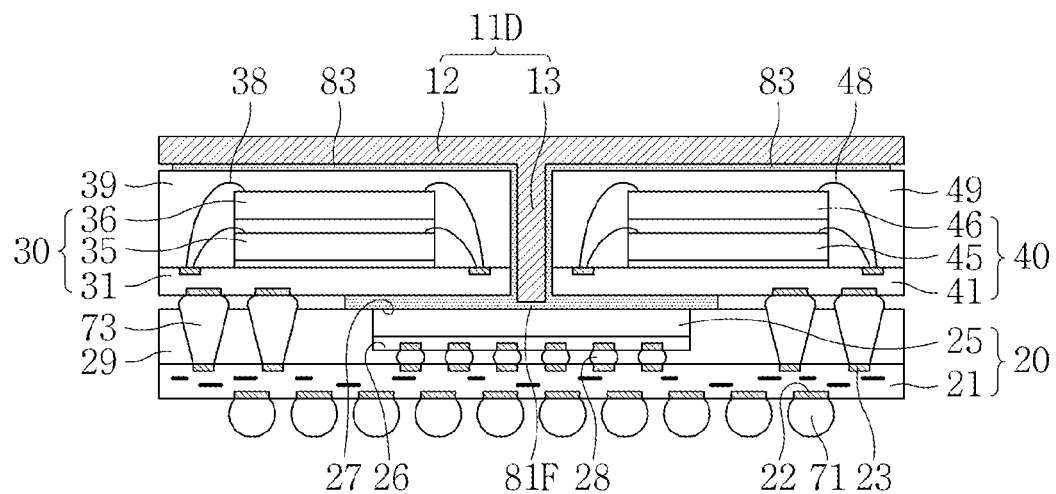

Referring to FIG. 15, a heat spreader 11D may include an upper plate 12 and a first extension part 13. The first extension part 13 may be arranged between the first upper package 30 and the second upper package 40. A first thermal interface material layer 81F may formed between the lower package 20 and the first extension part 13. The first thermal interface material layer 81F may extend between the first extension part 13 and the first upper package 30, and between the first extension part 13 and the second upper package 40. The first thermal interface material layer 81F may be connected to a second thermal interface material layer 83. The first thermal interface material layer 81F may extend between the lower package 20 and the first upper package 30, and between the lower package 20 and the second upper package 40. Heat generated from the first semiconductor chip 25 may be transferred to the first extension part 13 via the first thermal interface material layer 81F.

Figure 16:
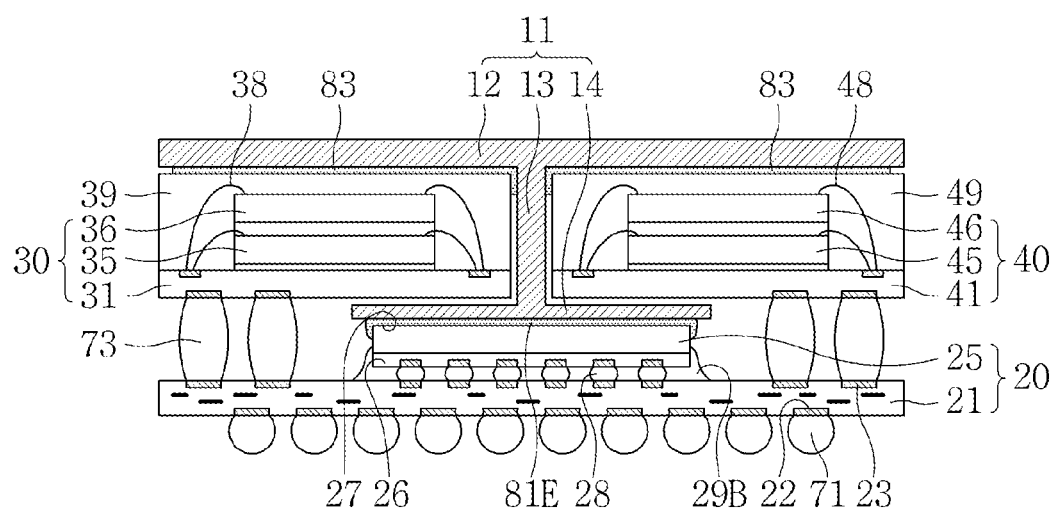

Referring to FIG. 16, an underfill layer 29B may be formed between a first board 21 and a first semiconductor chip 25. A first thermal interface material layer 81E may be formed between a lower plate 14 and the first semiconductor chip 25. The first thermal interface material layer 81E may extend onto a side surface of the first semiconductor chip 25.

Figure 17:
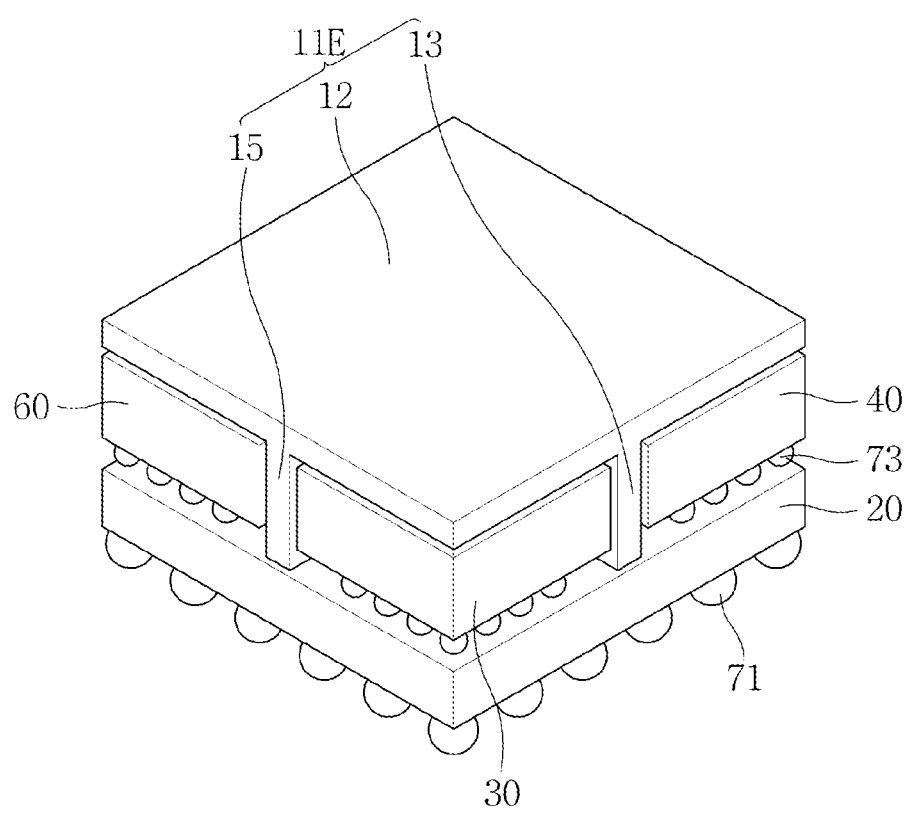
FIG. 17 is a perspective view illustrating a semiconductor package in accordance with embodiments of the inventive concept.
Figure 18:
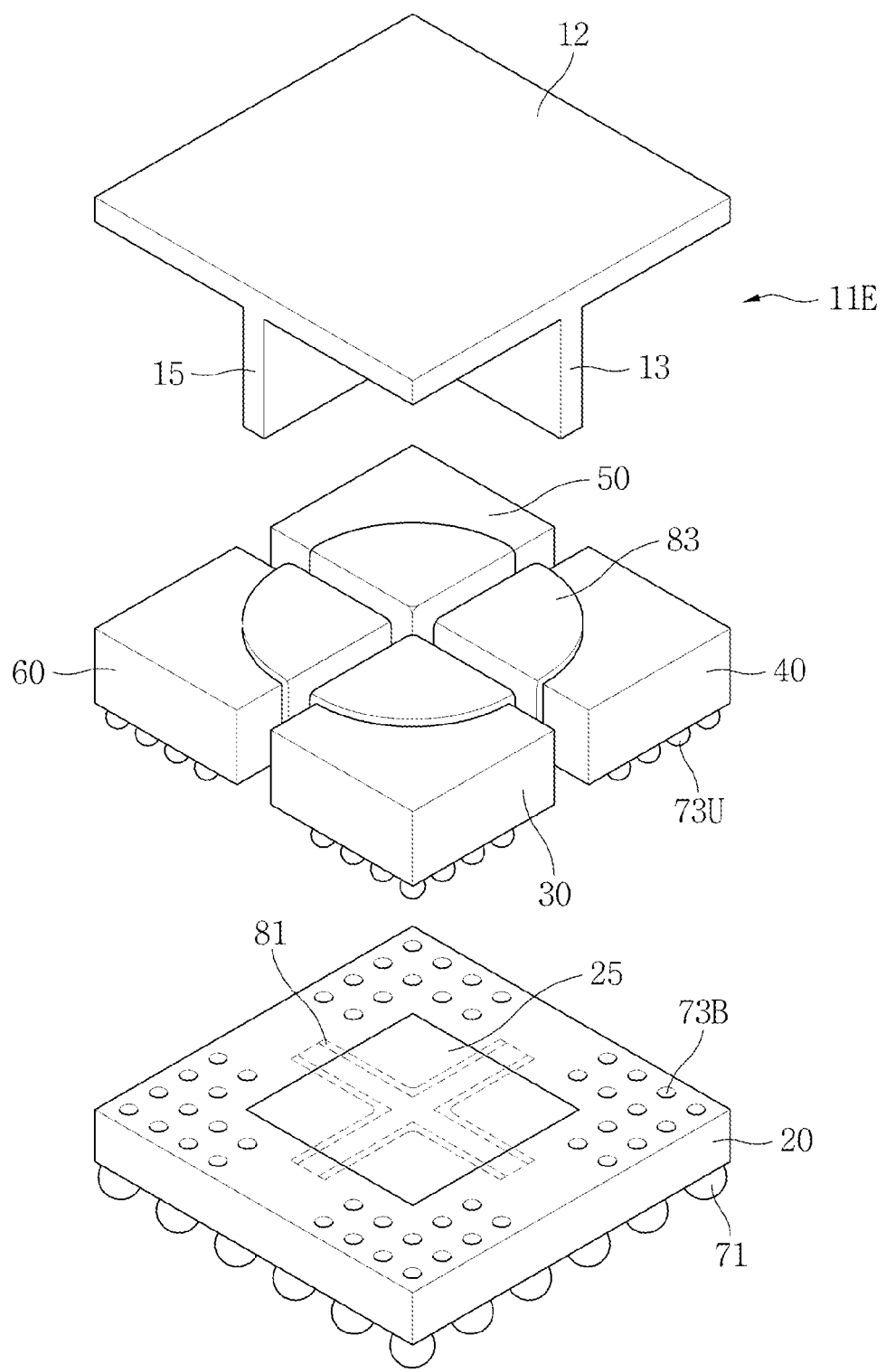
FIG. 18 is an exploded perspective view of the semiconductor package of FIG. 17.

FIG. 17 is a perspective view illustrating a semiconductor package in accordance with embodiments of the inventive concept, and FIG. 18 is an exploded perspective view of the semiconductor package of FIG. 17.

Referring to FIGS. 17 and 18, a first upper package 30, a second upper package 40, a third upper package 50 (as visible in FIG. 18), a fourth upper package 60, and a heat spreader 11E may be mounted on a lower package 20. The heat spreader 11E may include an upper plate 12, a first extension part 13, and a second extension part 15. Fourth connection terminals 73 may each include a corresponding upper connection terminal 73U and a corresponding lower connection terminal 73B.

A first thermal interface material layer 81 may be formed between the heat spreader 11E and the lower package 20. The first thermal interface material layer 81 may be in contact with the first extension part 13, the second extension part 15, and the lower package 20. The first thermal interface material layer 81 may be in contact with a first semiconductor chip 25. A second thermal interface material layer 83 may be formed between the upper plate 12 and the first upper package 30, between the upper plate 12 and the second upper package 40, between the upper plate 12 and the third upper package 50, and between the upper plate 12 and the fourth upper package 60.

The third upper package 50 and the fourth upper package 60 may include a similar configuration to the first upper package 30 or the second upper package 40.

Figure 19:
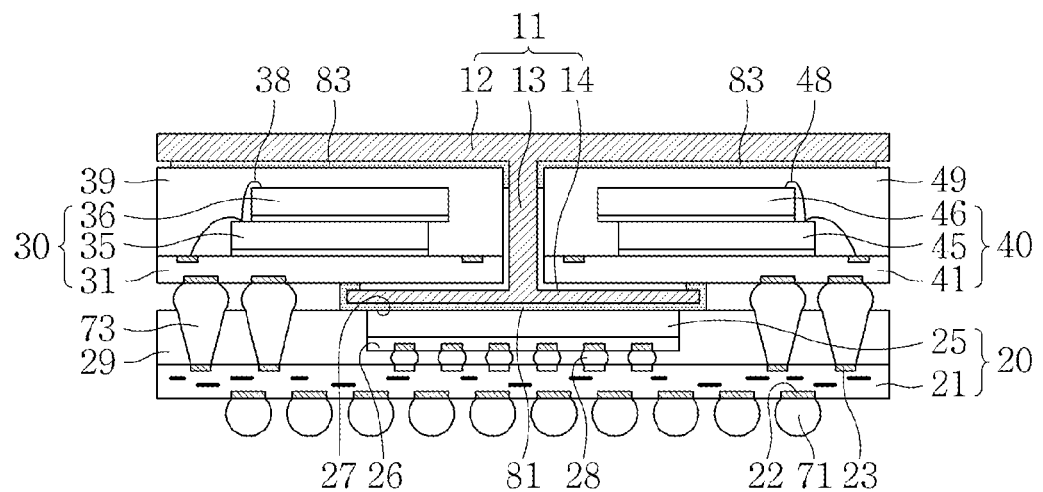
FIGS. 19 and 20 are cross-sectional views illustrating semiconductor packages in accordance with embodiments of the inventive concept.
Figure 20:
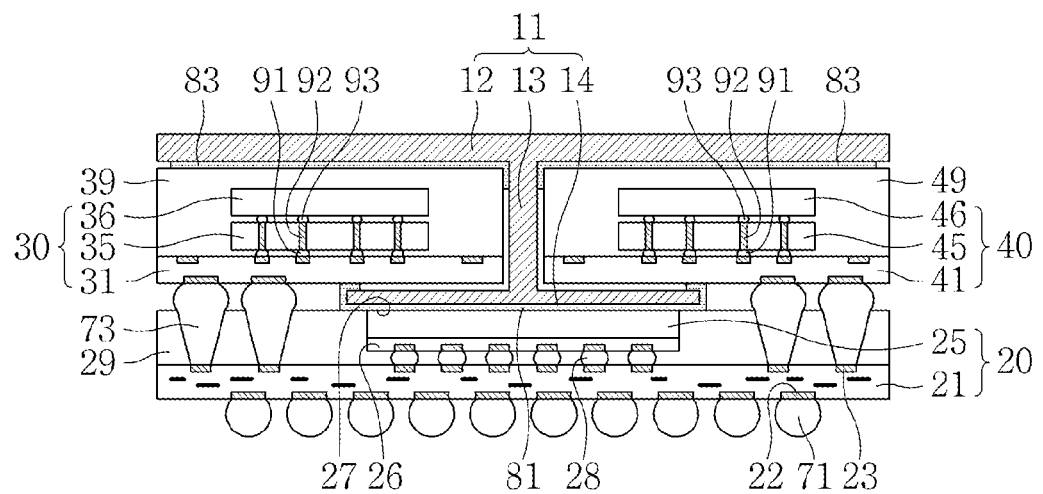

FIGS. 19 and 20 are cross-sectional views illustrating semiconductor packages in accordance with embodiments of the inventive concept.

Referring to FIG. 19, a second semiconductor chip 35 and a third semiconductor chip 36, which are mounted on a second board 31, may have a cascade stack structure. The third semiconductor chip 36 may be aligned so that it is offset laterally on the second semiconductor chip 35. A fourth semiconductor chip 45 and a fifth semiconductor chip 46 which are mounted on a third board 41, may have a similar cascade stack structure, but configured in the opposite direction.

In other embodiments, a plurality of other semiconductor chips may be stacked on the third semiconductor chip 36 or the fifth semiconductor chip 46.

Referring to FIG. 20, a first upper package 30 may include a second semiconductor chip 35 and a third semiconductor chip 36, which are mounted on a second board 31. A second upper package 40 may include a fourth semiconductor chip 45 and a fifth semiconductor chip 46, which are mounted on a third board 41. The second semiconductor chip 35 and the fourth semiconductor chip 45 may include a plurality of through-electrodes 92. Lower connection terminals 91 may be formed on lower ends of the through-electrodes 92, and upper connection terminals 93 may be formed on upper ends of the through-electrodes 92. The third semiconductor chip 36 may be connected to the second board 31 via the upper connection terminals 93, the through-electrodes 92, and the lower connection terminals 91. The second semiconductor chip 35 may be connected to the second board 31 via the lower connection terminals 91. The fifth semiconductor chip 46 may be connected to the third board 41 via the upper connection terminals 93, the through-electrodes 92, and the lower connection terminals 91. The fourth semiconductor chip 45 may be connected to the third board 41 via the lower connection terminals 91.

Each of the through-electrodes 92 may include Cu, Al, Ti, TiN, Ta, TaN, W, WN, Ni, Au, Ag, Pt, Ru, or any combination thereof. Each of the upper connection terminals 93 and lower connection terminals 91 may include a solder ball, a conductive bump, a conductive paste, or any combination thereof.

In other embodiments, a plurality of other semiconductor chips may be stacked between the second semiconductor chip 35 and the third semiconductor chip 36. A plurality of other semiconductor chips may be stacked between the fourth semiconductor chip 45 and the fifth semiconductor chip 46.

FIGS. 21 to 31 are partially enlarged views showing parts of semiconductor packages in accordance with embodiments of the inventive concept.

Figure 21:
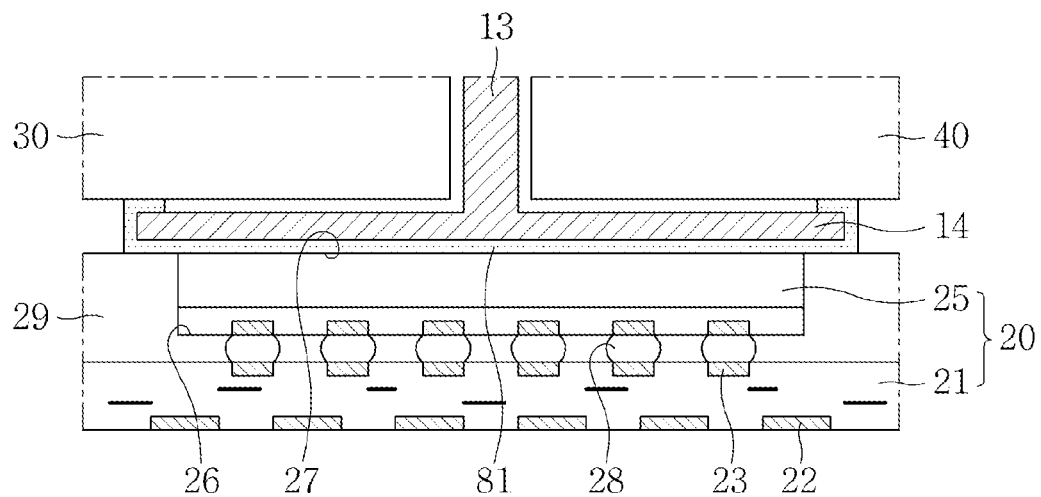
FIGS. 21 to 31 are partially enlarged views showing parts of semiconductor packages in accordance with embodiments of the inventive concept.

Referring to FIG. 21, a first extension part 13 may be formed between a first upper package 30 and a second upper package 40. A lower plate 14 may overlap between the first upper package 30 and a lower package 20 and between the second upper package 40 and the lower package 20. The lower plate 14 may have a greater horizontal width than a first semiconductor chip 25. The lower plate 14 may fully cover the first semiconductor chip 25, and extend onto a first encapsulant 29. A part of the first upper package 30 may vertically overlap the first semiconductor chip 25. A part of the second upper package 40 may vertically overlap the first semiconductor chip 25.

A first thermal interface material layer 81 may be formed between the lower plate 14 and the lower package 20. The first thermal interface material layer 81 may have a greater horizontal width than the lower plate 14. The first thermal interface material layer 81 may fully cover the first semiconductor chip 25, and extend onto the first encapsulant 29. The first thermal interface material layer 81 may extend onto side and upper surfaces of the lower plate 14. The first thermal interface material layer 81 may be in direct contact with the lower plate 14 and the lower package 20. The first thermal interface material layer 81 may be in contact with the first semiconductor chip 25.

Figure 22:
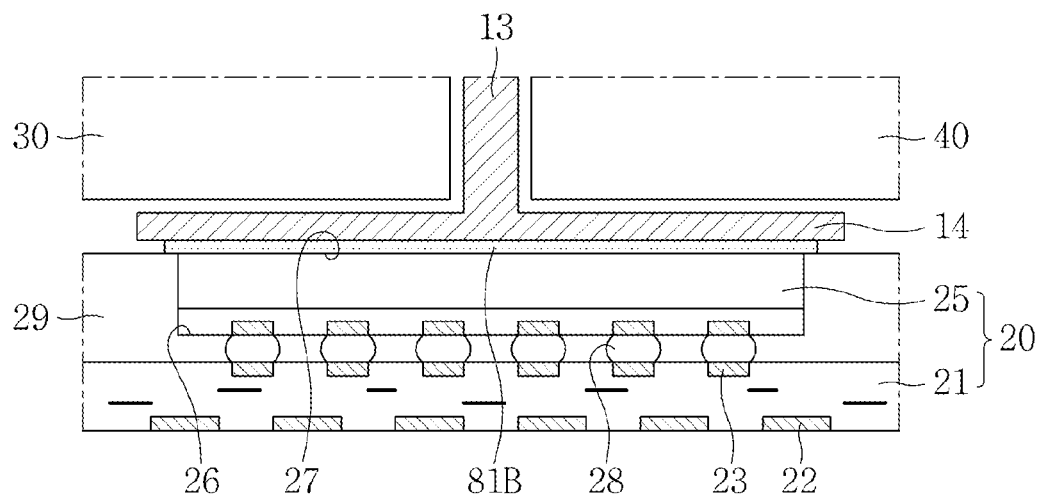

Referring to FIG. 22, a first thermal interface material layer 81B may have a smaller horizontal width than a lower plate 14. The first thermal interface material layer 81B may have a greater horizontal width than a first semiconductor chip 25. The first thermal interface material layer 81B may fully cover the first semiconductor chip 25, and extend onto a first encapsulant 29.

Figure 23:
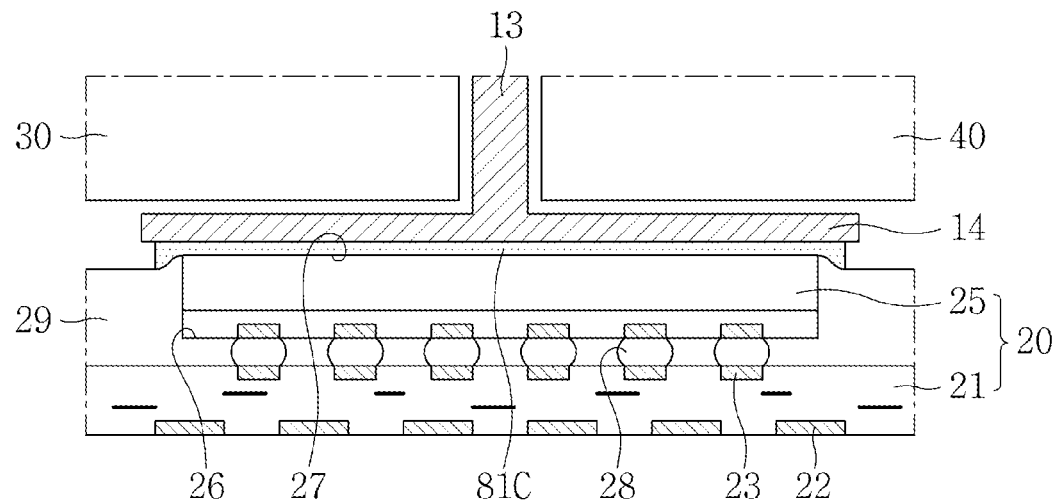

Referring to FIG. 23, a first encapsulant 29 may be formed at a lower level than an upper end of a first semiconductor chip 25. A first thermal interface material layer 81C may have a smaller horizontal width than a lower plate 14. The first thermal interface material layer 81C may fully cover the first semiconductor chip 25, and extend onto the first encapsulant 29. A lower end of the first thermal interface material layer 81C may be formed at a lower level than the upper end of the first semiconductor chip 25.

Figure 24:
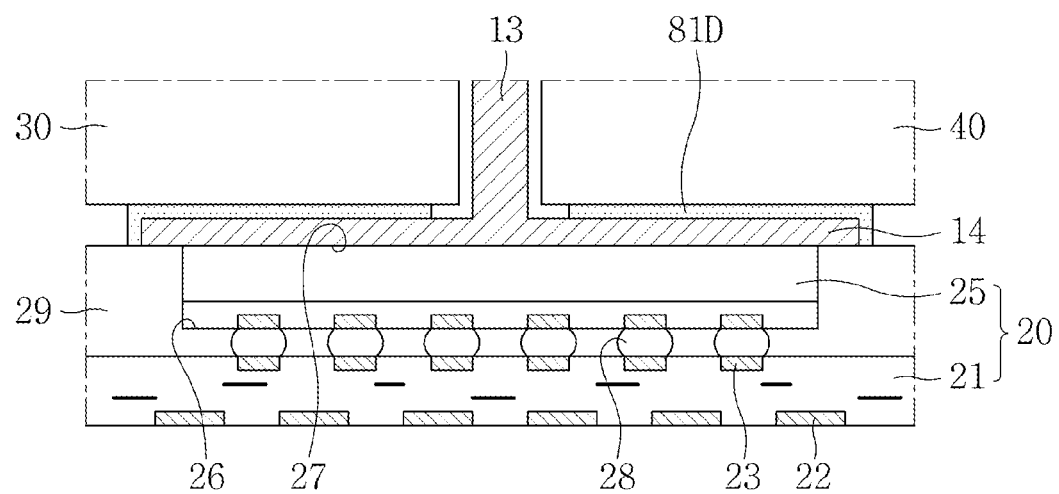

Referring to FIG. 24, a lower plate 14 may be in direct contact with a first semiconductor chip 25 and a first encapsulant 29. A first thermal interface material layer 81D may be formed between the lower plate 14 and a first upper package 30, and between the lower plate 14 and a second upper package 40. The first thermal interface material layer 81D may extend to cover a side surface of the lower plate 14.

Figure 25:
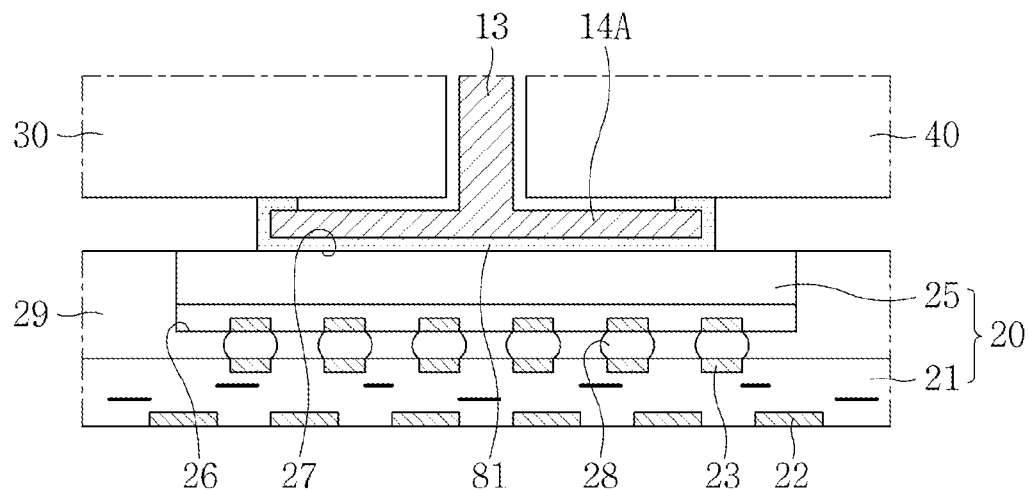

Referring to FIG. 25, a lower plate 14A may have a smaller horizontal width than a first semiconductor chip 25.

Figure 26:
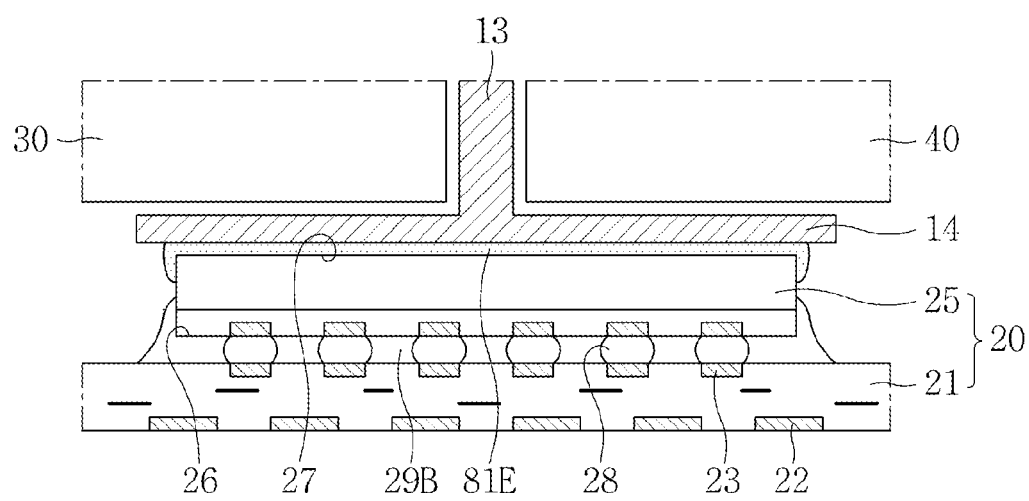

Referring to FIG. 26, a lower plate 14 may have a greater horizontal width than a first semiconductor chip 25. An underfill layer 29B may be formed between a first board 21 and a first semiconductor chip 25. A first thermal interface material layer 81E may be formed between the lower plate 14 and the first semiconductor chip 25. The first thermal interface material layer 81E may extend onto a side surface of the first semiconductor chip 25.

Figure 27:
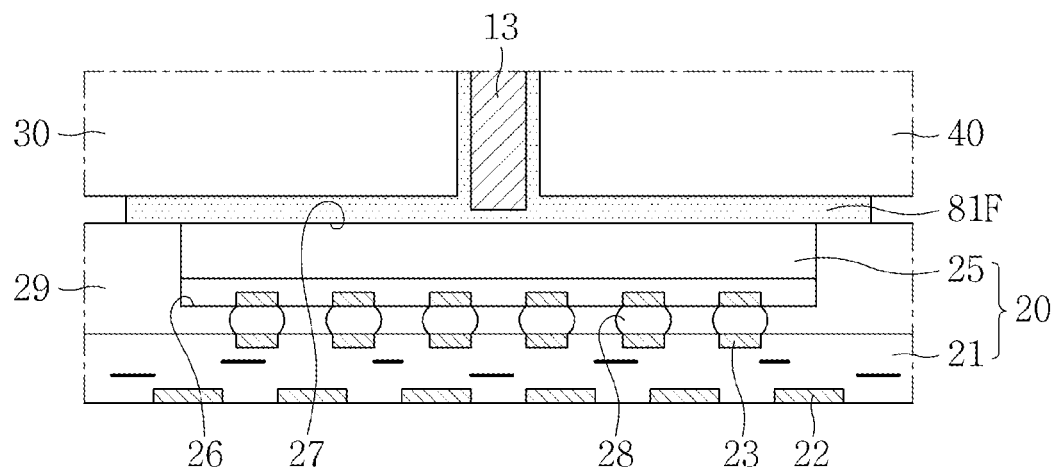

Referring to FIG. 27, a first extension part 13 may be formed between a first upper package 30 and a second upper package 40. A first thermal interface material layer 81F may be formed between a lower package 20 and the first extension part 13. The first thermal interface material layer 81F may extend between the first extension part 13 and the first upper package 30, and between the first extension part 13 and the second upper package 40. The first thermal interface material layer 81F may extend between the lower package 20 and the first upper package 30, and between the lower package 20 and the second upper package 40. The first thermal interface material layer 81F may have a greater horizontal width than a first semiconductor chip 25. The first thermal interface material layer 81F may fully cover the first semiconductor chip 25, and extend onto a first encapsulant 29.

Figure 28:
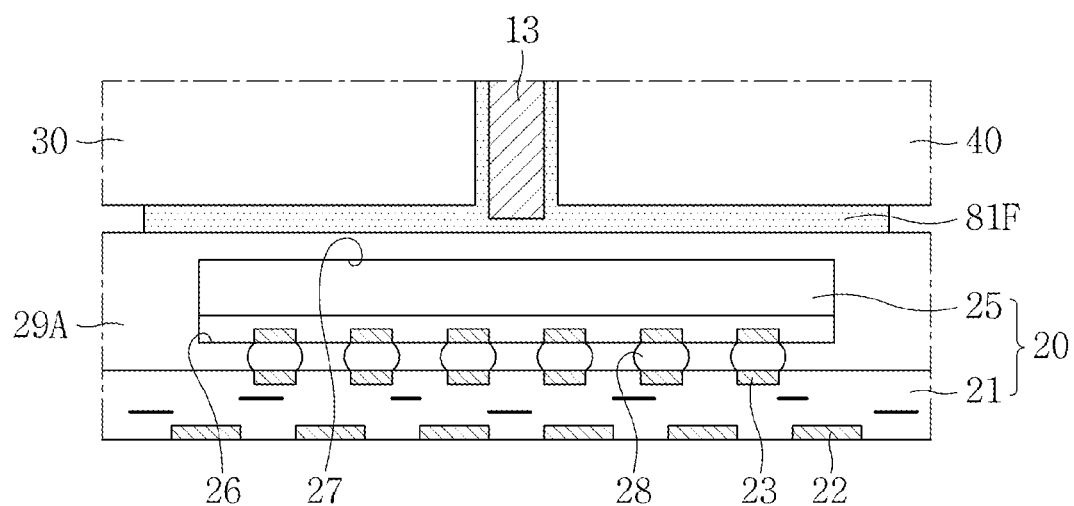

Referring to FIG. 28, a first encapsulant 29 may fully cover an upper surface of a first semiconductor chip 25. A first thermal interface material layer 81F may be formed on the first encapsulant 29. The first thermal interface material layer 81F may be interposed between the first encapsulant 29 and a first extension part 13.

Figure 29:
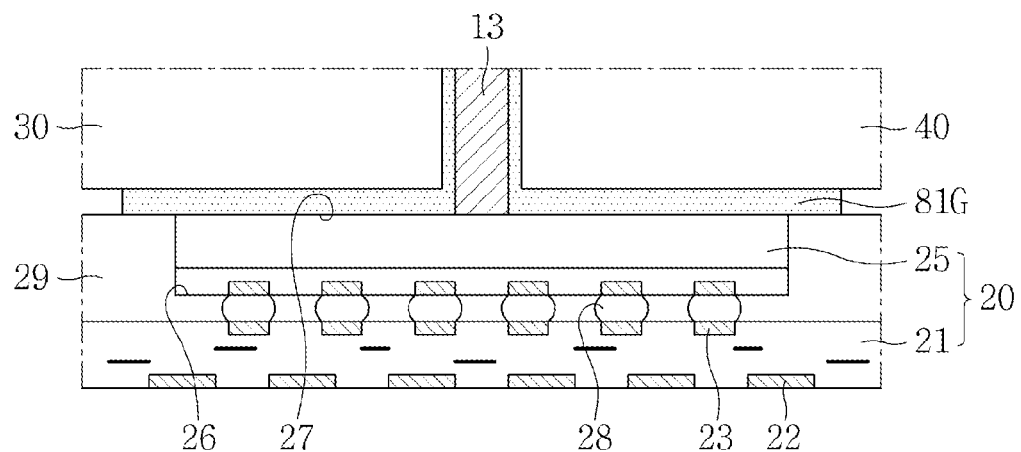

Referring to FIG. 29, a first extension part 13 may be in direct contact with a first semiconductor chip 25. A first thermal interface material layer 81G may be formed between a lower package 20 and a first upper package 30, and between the lower package 20 and a second upper package 40. The first thermal interface material layer 81G may be in contact with a side surface of the first extension part 13. The first thermal interface material layer 81G may be in contact with the first semiconductor chip 25.

Figure 30:
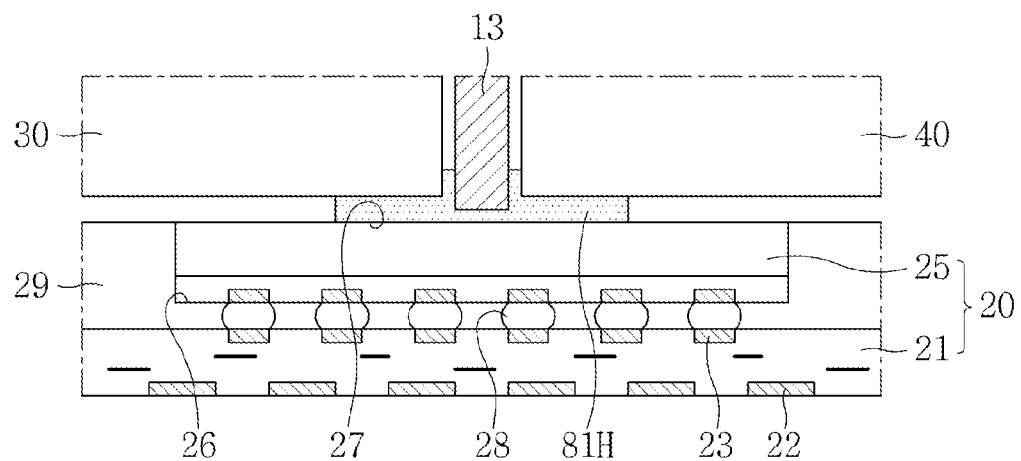

Referring to FIG. 30, a first thermal interface material layer 81H may have a smaller horizontal width than a first semiconductor chip 25. The first thermal interface material layer 81H may be in contact with a first extension part 13 and the first semiconductor chip 25.

Figure 31:
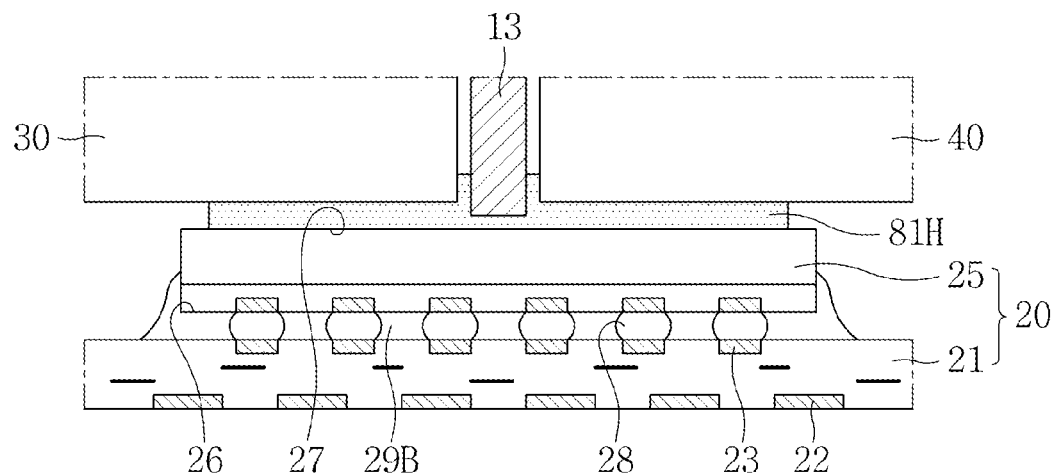

Referring to FIG. 31, a first thermal interface material layer 81H may have a smaller horizontal width than a first semiconductor chip 25. An underfill layer 29B may be formed between a first board 21 and the first semiconductor chip 25.

FIGS. 32 to 39 are cross-sectional views illustrating methods of forming semiconductor packages in accordance with embodiments of the inventive concept.

Figure 32:
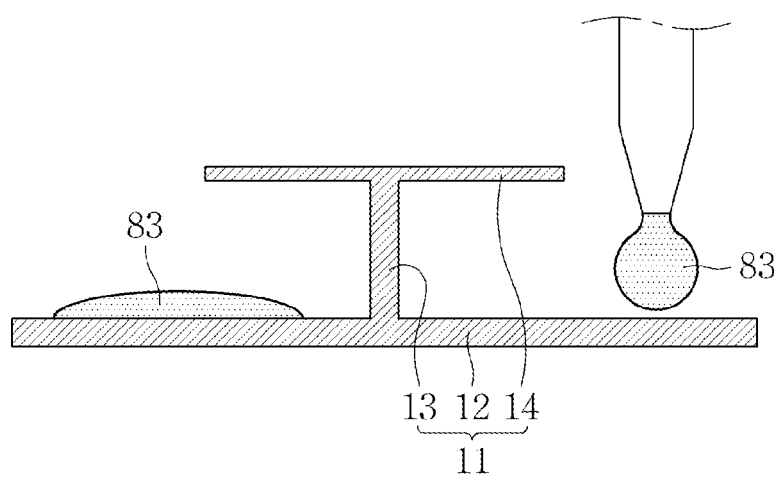
FIGS. 32 to 39 are cross-sectional views illustrating methods of forming semiconductor packages in accordance with embodiments of the inventive concept.

Referring to FIG. 32, a second thermal interface material layer 83 may be formed on a heat spreader 11. The heat spreader 11 may include an upper plate 12, a first extension part 13, and a lower plate 14. The heat spreader 11 may be interpreted as being upside down. The upper plate 12 may have a greater horizontal width than the lower plate 14. The second thermal interface material layer 83 may be in contact with the upper plate 12.

Figure 33:
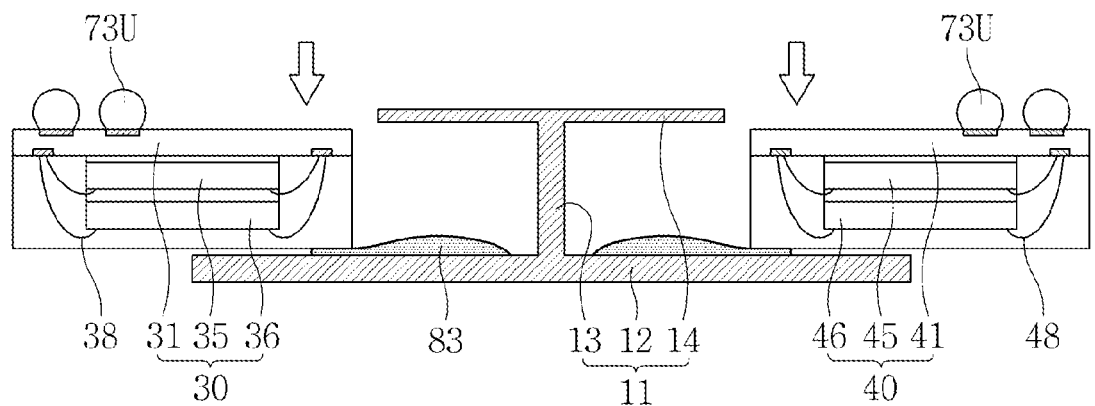

Referring to FIG. 33, a first upper package 30 and a second upper package 40 may be loaded on the upper plate 12. The first upper package 30 and the second upper package 40 may include upper connection terminals 73U. Each of the upper connection terminals 73U may include a solder ball, a conductive bump, a conductive paste, or any combination thereof.

The first upper package 30 may include a second semiconductor chip 35 and a third semiconductor chip 36, which are mounted on a second board 31. The second semiconductor chip 35 and the third semiconductor chip 36 may be connected to the second board 31 by second connection terminals 38. The second upper package 40 may include a fourth semiconductor chip 45 and a fifth semiconductor chip 46, which are mounted on a third board 41. The fourth semiconductor chip 45 and the fifth semiconductor chip 46 may be connected to the third board 41 by third connection terminals 48.

The first upper package 30 and the second upper package 40 may be interpreted as being upside down.

Figure 34:
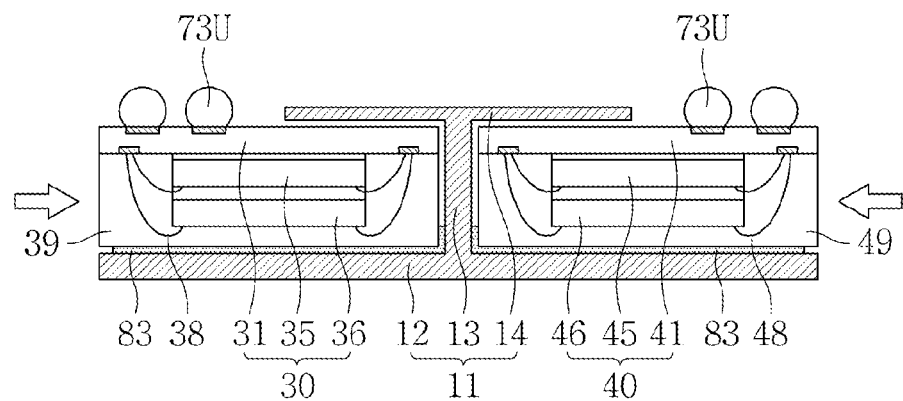

Referring to FIG. 34, the first upper package 30 and the second upper package 40 may be combined or otherwise slid into place between the upper plate 12 and the lower plate 14 so that they are disposed adjacent to each other and spaced apart from each by the first extension part 13. The second thermal interface material layer 83 may be formed between the upper plate 12 and the first upper package 30, and between the upper plate 12 and the second upper package 40. The second thermal interface material layer 83 may extend between the first extension part 13 and the first upper package 30, and between the first extension part 13 and the second upper package 40.

Figure 35:
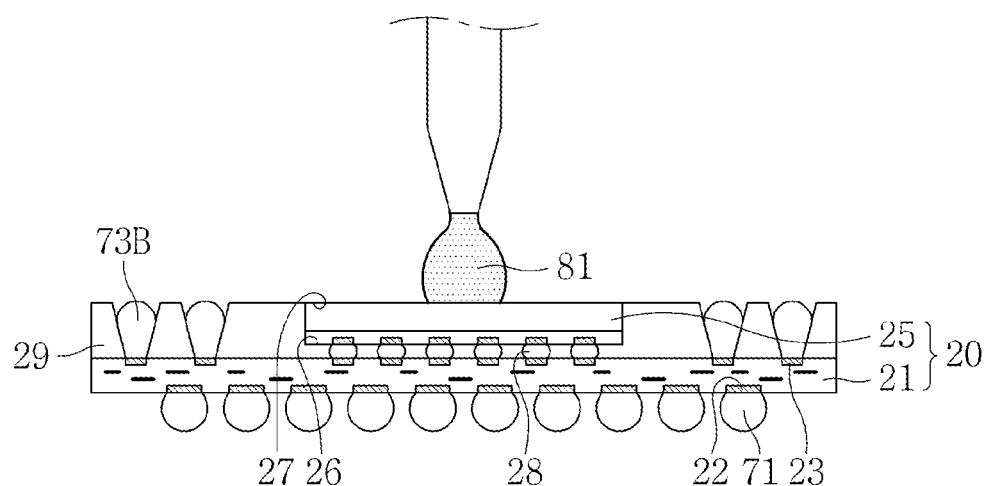

Referring to FIG. 35, a first thermal interface material layer 81 may be formed on a lower package 20. The lower package 20 may include a first semiconductor chip 25 and lower connection terminals 73B. The first thermal interface material layer 81 may be in contact with a non-active surface 27 of the first semiconductor chip 25. Each of the lower connection terminals 73B may include a solder ball, a conductive bump, a conductive paste, or any combination thereof.

Figure 36:
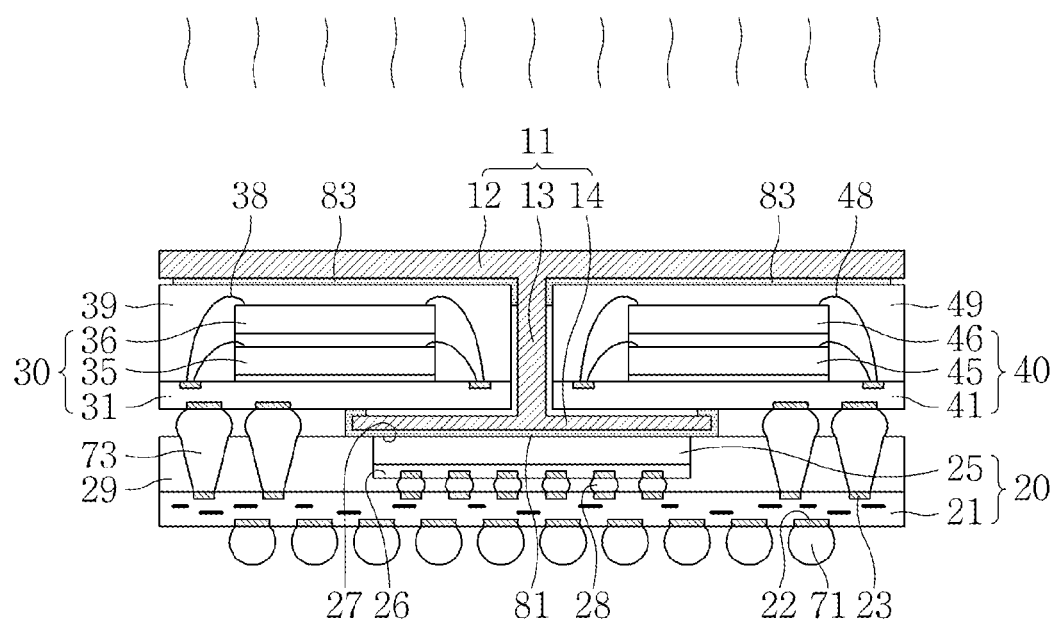

Referring to FIG. 36, the first upper package 30, the second upper package 40, and the heat spreader 11 may be attached on the lower package 20. The first thermal interface material layer 81 may be retained between the lower plate 14 and the lower package 20. The lower connection terminals 73B (of FIG. 35) and the upper connection terminals 73U (of FIG. 34) may be combined to form fourth connection terminals 73. The attachment of the first upper package 30, the second upper package 40, and the heat spreader 11 on the lower package 20 may include a heat treatment process.

Figure 37:
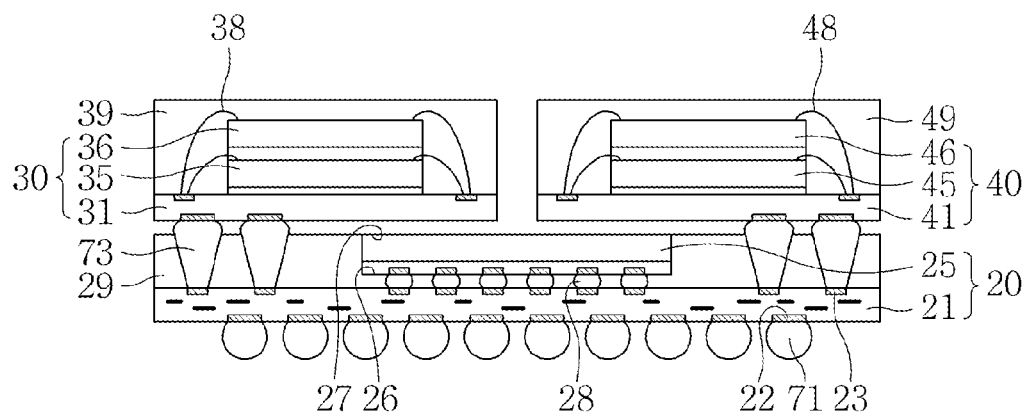

Referring to FIG. 37, a first upper package 30 and a second upper package 40 may be attached on a lower package 20 using fourth connection terminals 73 passing through a first encapsulant 29.

Figure 38:
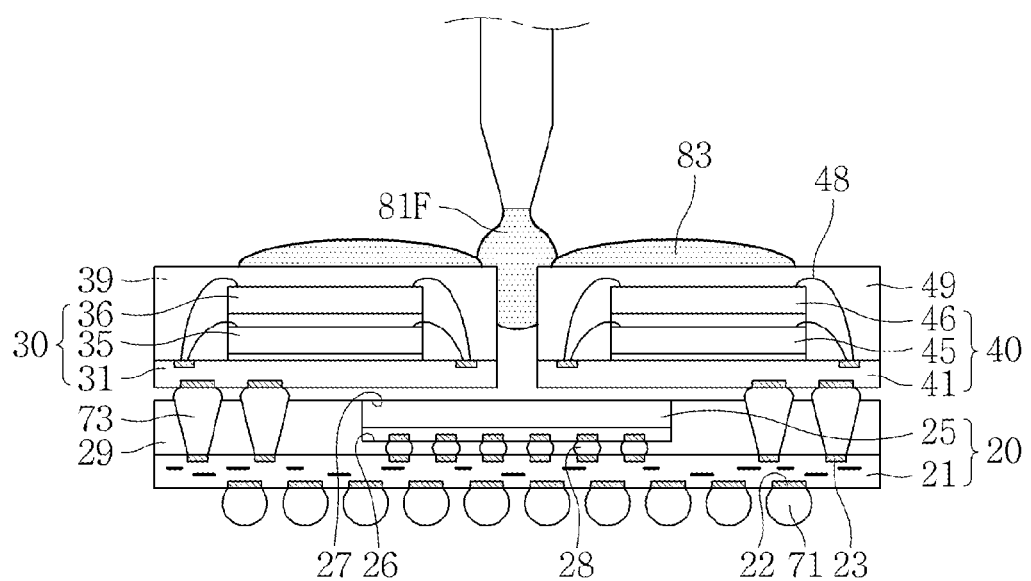

Referring to FIG. 38, a first thermal interface material layer 81F may be formed between the first upper package 30 and the second upper package 40. A second thermal interface material layer 83 may be formed on the first upper package 30 and the second upper package 40.

Figure 39:
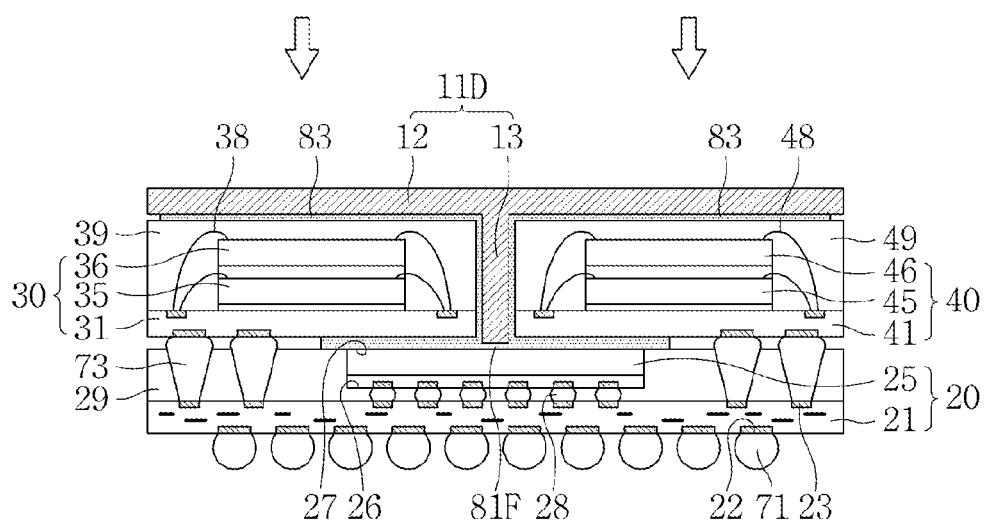

Referring to FIG. 39, a heat spreader 11D may be mounted on the lower package 20. The heat spreader 11D may include an upper plate 12 and a first extension part 13. The first extension part 13 may be inserted between the first upper package 30 and the second upper package 40. The first thermal interface material layer 81F may be retained between the first extension part 13 and the lower package 20. The first thermal interface material layer 81F may penetrate between the lower package 20 and the first upper package 30 and between the lower package 20 and the second upper package 40.

Figure 40:
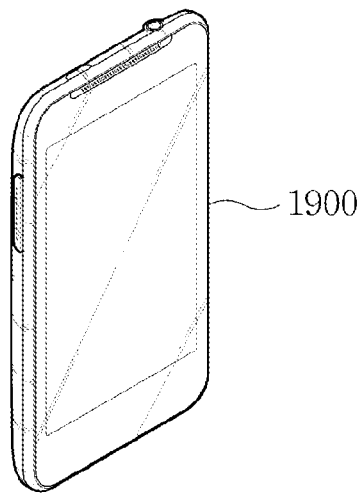
FIGS. 40 and 41 are a perspective view and a system block diagram showing an electronic apparatus in accordance with embodiments of the inventive concept.
Figure 41:
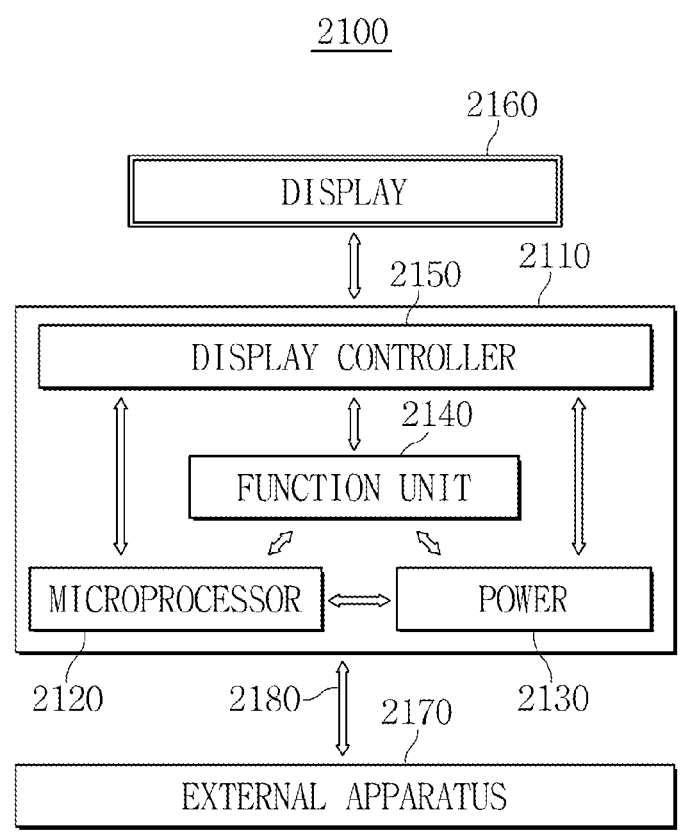

FIGS. 40 and 41 are a perspective view and a system block diagram showing an electronic apparatus in accordance with embodiments of the inventive concept.

Referring to FIG. 40, a semiconductor package described with reference to FIGS. 1 to 39 may be usefully applied to electronic systems, such as a smartphone 1900, an embedded multi-media chip (eMMC), a micro SD, a netbook, a laptop computer, or a tablet PC. For example, a semiconductor package as described with reference to FIGS. 1 to 39 may be installed in a mainboard of the smartphone 1900. The semiconductor package as described with reference to FIGS. 1 to 39 may be provided to an expansion apparatus, such as the micro SD, to be used combined with the smartphone 1900.

Referring to FIG. 41, a semiconductor package as described with reference to FIGS. 1 to 39 may be applied to an electronic system 2100. The electronic system 2100 may include a body 2110, a microprocessor unit 2120, a power unit 2130, a function unit 2140, and a display controller unit 2150. The body 2110 may be a motherboard formed of a printed circuit board (PCB). The microprocessor unit 2120, the power unit 2130, the function unit 2140, and the display controller unit 2150 may be installed on the body 2110. A display unit 2160 may be arranged inside or outside of the body 2110. For example, the display unit 2160 may be arranged on a surface of the body 2110 and display an image processed by the display controller unit 2150.

The power unit 2130 may function to receive a constant voltage from an external battery (not shown), etc., divide the voltage into various levels as required, and supply those voltages to the microprocessor unit 2120, the function unit 2140, and the display controller unit 2150, etc. The microprocessor unit 2120 may receive a voltage from the power unit 2130 to control the function unit 2140 and the display unit 2160. The function unit 2140 may perform various functions of the electronic system 2100. For example, when the electronic system 2100 is a smartphone, the function unit 2140 may have several components which perform functions of the mobile phone such as output of an image to the display unit 2160 or output of a voice to a speaker, by dialing or communication with an external apparatus 2170. If a camera is installed, the function unit 2140 may function as a camera image processor.

In the embodiment to which the inventive concept is applied, when the electronic system 2100 is connected to a memory card, etc. in order to expand capacity, the function unit 2140 may be a memory card controller. The function unit 2140 may exchange signals with the external apparatus 2170 through a wired or wireless communication unit 2180. In addition, when the electronic system 2100 needs a universal serial bus (USB), etc. in order to expand functionality, the function unit 2140 may function as an interface controller. Further, the function unit 2140 may include a mass storage apparatus.

A semiconductor package as described with reference to FIGS. 1 to 39 may be applied to the function unit 2140 or the microprocessor unit 2120.

In accordance with embodiments of the inventive concept, a first upper package, a second upper package, and a heat spreader may be formed on a lower package. A thermal interface material (TIM) layer may be formed between the heat spreader and the lower package. The heat spreader may include an upper plate arranged on the first upper package and the second upper package, and an extension part connected to the upper plate and arranged between the first upper package and the second upper package. At least a part of the first upper package and second upper package may vertically overlap the semiconductor chip. The extension part may have a vertical height that is greater than its horizontal width (i.e., greater than its horizontal thickness). The arrangement of the extension part, the thermal interface material layer, the first upper package, and the second upper package may be significantly advantageous to high integration. The thermal interface material layer and the heat spreader may function to prevent heat generated from the lower package from being transferred to the first upper package and the second upper package. The thermal interface material layer and the heat spreader may function to efficiently dissipate the heat generated from the lower package to the atmosphere. A semiconductor package having improved heat dissipation and that is advantageous to high integration may be implemented.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A semiconductor package, comprising:
a lower package having a semiconductor chip;
first and second upper packages having a plurality of semiconductor chips disposed on the lower package; and
a heat spreader having an upper plate and an extension part connected to the upper plate, the extension part being arranged on the lower package,
wherein at least a part of the first and second upper packages vertically overlaps the semiconductor chip,
the upper plate is arranged on the first upper package and the second upper package,
the extension part is arranged between the first upper package and the second upper package adjoining side surfaces of the first upper package and the second upper package, and
the extension part has a vertical height that is greater than its horizontal width.

2. The semiconductor package of claim 1, wherein the vertical height of the extension part is greater than that of the first upper package.

3. The semiconductor package of claim 1, wherein the extension part is in contact with a portion of the lower package.

4. The semiconductor package of claim 1, further comprising a thermal interface material (TIM) layer disposed between the heat spreader and the lower package,
wherein the TIM layer is in partial contact with the extension part and the lower package.

5. The semiconductor package of claim 4, wherein the TIM layer is in contact with the semiconductor chip.

6. The semiconductor package of claim 4, wherein the horizontal width of the TIM layer is greater than that of the semiconductor chip.

7. The semiconductor package of claim 1, wherein:
the heat spreader further comprises a lower plate connected to the extension part, the extension part is arranged between the upper plate and the lower plate, and the lower plate has a horizontal width that is greater than its vertical height.

8. The semiconductor package of claim 7, wherein:
the lower plate extends between the first upper package and the lower package, and
the lower plate extends between the second upper package and the lower package.

9. The semiconductor package of claim 7, wherein the horizontal width of the lower plate is greater than that of the semiconductor chip.

10. The semiconductor package of claim 1, wherein the heat spreader further comprises a side plate connected to a side surface of the upper plate.

11. The semiconductor package of claim 1, further comprising a thermal interface material (TIM) layer disposed between the upper plate of the heat spreader and at least a portion of the first upper package, and between the upper plate of the heat spreader and at least a portion of the second upper package.

12. A semiconductor package, comprising:
a lower package having a semiconductor chip;
first and second upper packages having a plurality of semiconductor chips disposed on the lower package; and
a heat spreader having an upper plate, a lower plate, and an extension part connected between the upper plate and the lower plate of the heat spreader, the heat spreader being arranged on the lower package,
wherein at least a part of the first and second upper packages vertically overlaps the semiconductor chip,
the upper plate is arranged on the first upper package and the second upper package,
the extension part is arranged between the first upper package and the second upper package adjoining side surfaces of the first upper package and the second upper package,
the lower plate is arranged between the first upper package and the lower package, and
the lower plate is arranged between the second upper package and the lower package.

13. The semiconductor package of claim 12, wherein the lower plate fully covers a non-active surface of the semiconductor chip.

14. The semiconductor package of claim 12, further comprising a thermal interface material (TIM) layer disposed between the lower plate and the lower package.

15. The semiconductor package of claim 14, wherein the TIM layer is in partial contact with the semiconductor chip and the lower plate.

16. The semiconductor package of claim 14, wherein the TIM layer fully covers a non-active surface of the semiconductor chip.

17. The semiconductor package of claim 12, further comprising a thermal interface material (TIM) layer disposed between the upper plate of the heat spreader and at least a portion of the first upper package, and between the upper plate of the heat spreader and at least a portion of the second upper package.

* * * * *